United States Patent
Yang et al.

(10) Patent No.: US 12,265,327 B2
(45) Date of Patent: Apr. 1, 2025

(54) SEMICONDUCTOR MANUFACTURING APPARATUS AND METHOD THEREOF

(71) Applicant: Taiwan Semiconductor Manufacturing Co., Ltd., Hsin-Chu (TW)

(72) Inventors: Ching-Hai Yang, Taipei (TW); Yao-Hwan Kao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 447 days.

(21) Appl. No.: 16/513,119

(22) Filed: Jul. 16, 2019

(65) Prior Publication Data
US 2020/0033723 A1    Jan. 30, 2020

Related U.S. Application Data

(60) Provisional application No. 62/711,880, filed on Jul. 30, 2018.

(51) Int. Cl.
| | | |
|---|---|---|
| *G03F 7/00* | (2006.01) | |
| *G03F 7/16* | (2006.01) | |
| *H01L 21/66* | (2006.01) | |
| *H01L 21/67* | (2006.01) | |

(52) U.S. Cl.
CPC ........ *G03F 7/0035* (2013.01); *G03F 7/70475* (2013.01); *G03F 7/70608* (2013.01); *H01L 21/67253* (2013.01); *H01L 22/10* (2013.01); *G03F 7/162* (2013.01)

(58) Field of Classification Search
CPC ...... G03F 7/70608; H01L 22/10; H01L 22/12
See application file for complete search history.

(56) References Cited

U.S. PATENT DOCUMENTS

| | | | |
|---|---|---|---|
| 7,327,475 B1 * | 2/2008 | Chu | ............... H01L 22/20 257/E21.525 |
| 8,796,666 B1 | 8/2014 | Huang et al. | |
| 8,837,810 B2 | 9/2014 | Chen et al. | |
| 9,093,530 B2 | 4/2015 | Huang et al. | |
| 9,134,633 B2 | 9/2015 | Lin et al. | |
| 9,213,234 B2 | 12/2015 | Chang | |
| 9,223,220 B2 | 12/2015 | Chang | |
| 9,230,867 B2 | 1/2016 | Cheng et al. | |
| 9,256,133 B2 | 2/2016 | Chang | |

(Continued)

FOREIGN PATENT DOCUMENTS

| | | |
|---|---|---|
| TW | 200530418 A | 9/2005 |
| TW | 201425862 A | 7/2014 |
| TW | 201704719 A | 2/2017 |

OTHER PUBLICATIONS

B. Klein, Monochromaticity: the spectrum of a laser or other light source, found at https://bklein.ece.gatech.edu/laser-photonics/monochromaticity-the-spectrum-of-a-laser-or-other-light-source/#:~:text=Laser%20light%20has%20a%20much,off%20introduces%20more%20frequency%20components, last visited Oct. 31, 2023.*

*Primary Examiner* — James M Mellott
(74) *Attorney, Agent, or Firm* — HAYNES AND BOONE, LLP

(57) ABSTRACT

A method, comprising forming a material layer over a substrate; illuminating at least one region of the material layer with a light; recording strength of the light reflected from the at least one region; and determining a thickness of the material layer in the at least one region according to the strength of the light.

20 Claims, 9 Drawing Sheets

(56) References Cited

U.S. PATENT DOCUMENTS

| | | | |
|---|---|---|---|
| 9,304,403 B2 | 4/2016 | Lin et al. | |
| 9,404,743 B2 | 8/2016 | Chiu et al. | |
| 9,536,759 B2 | 1/2017 | Yang et al. | |
| 9,548,303 B2 | 1/2017 | Lee et al. | |
| 9,823,585 B2 | 11/2017 | Shih et al. | |
| 9,841,687 B2 | 12/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 2002/0102483 A1* | 8/2002 | Adams | G03F 7/091 430/30 |
| 2003/0030808 A1* | 2/2003 | Marshall | G01J 1/4228 356/406 |
| 2005/0151962 A1* | 7/2005 | Ziger | G01B 11/0625 356/128 |
| 2010/0129737 A1* | 5/2010 | Sakurai | G03F 7/3028 430/311 |
| 2014/0017392 A1* | 1/2014 | Lewis | B05C 9/14 118/712 |
| 2018/0061032 A1* | 3/2018 | Benvegnu | B24B 37/013 |

* cited by examiner

| Resist Material | Light Wavelength (or Color) | Polynomial Function |
|---|---|---|
| Material A | Blue | y=-1.6x+1154.4 |
| Material B | Green | y=-3.1x+1021.8 |
| ... | ... | ... |
| ... | ... | ... |

FIG. 6A

| Light Intensity | Resist Thickness |
|---|---|
| 170 | 882.4 |
| 171 | 880.8 |
| ... | ... |
| 205 | 826.4 |
| ... | ... |

FIG. 6B

SEMICONDUCTOR MANUFACTURING APPARATUS AND METHOD THEREOF

PRIORITY DATA

This application claims priority to U.S. Provisional Patent Application Ser. No. 62/711,880 entitled "Semiconductor Manufacturing Apparatus and Method Thereof," filed on Jul. 30, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Many of the technological advances in semiconductors have occurred in the field of semiconductor manufacturing apparatus. Semiconductor processes for forming integrated circuits requires a series of processing steps and various apparatus. These processing steps include the deposition and patterning of a variety of material layers, such as insulating layers, polysilicon layers, metal layers, and the like. The material layers are typically patterned using a patterned resist layer (e.g., a photoresist layer or a tri-layer resist stack) as an etch mask that is patterned over the material layer. The resist layer is deposited to the desired thickness by spin coating. In some embodiments, the resist layer is then subjected to monochromatic radiation (light) through a photomask or reticle, and then developed in a developer to form the etch mask. As the minimum feature sizes on the semiconductor circuits decrease to submicron dimensions, it becomes necessary to more accurately control critical dimensions (CDs). However, CDs are dependent on numerous processing parameters, such as resist material compositions, radiation dose, development time, and resist layer thickness. Therefore, to accurately control CDs, it is necessary to accurately determine the resist layer thickness. Current semiconductor manufacturing apparatus and fabrication methods, while suitable in many respects, can struggle to meet the desired performance and reliability criteria, such as controlling resist layer thickness in a speedy fashion during mass production. Therefore, further improvements in this area are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A and 6B illustrate index tables stored in a database according to the method of FIG. 5, in accordance with an embodiment.

DETAILED DESCRIPTION

Figure 1:
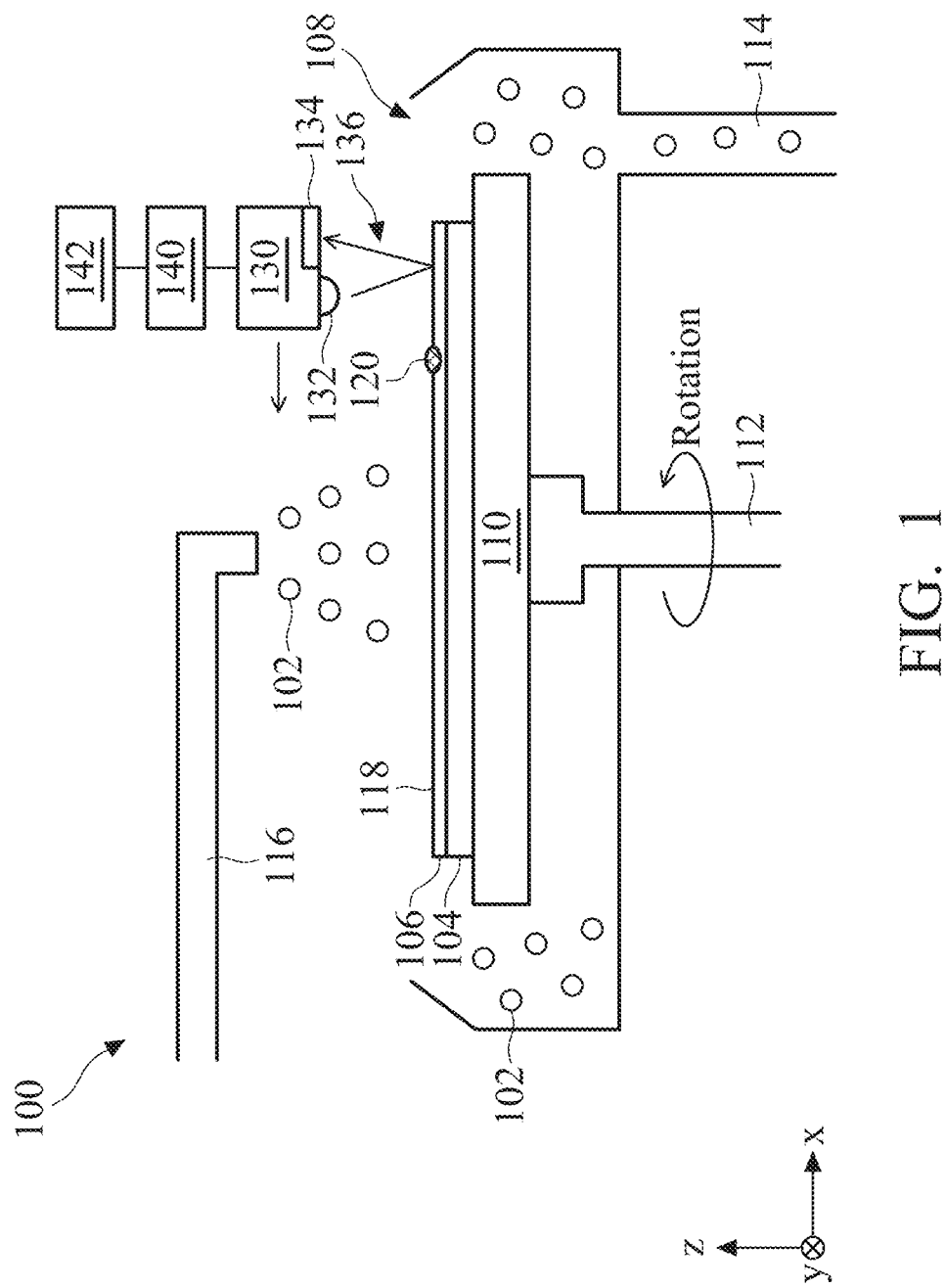
FIG. 1 illustrates an apparatus used in spin coating a resist layer on a semiconductor substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor apparatus and fabrication methods thereof. More particularly, the present disclosure is related to a spin-coating apparatus for forming a resist layer on a semiconductor substrate and a method of measuring the resist layer thickness in-situ to feedback to the device for adjusting process conditions, such as spin speed, to achieve a different resist layer thickness.

FIG. 1 illustrates a cross-sectional view of a spin-coating apparatus 100 for dispensing resist material 102 on a substrate 104 (e.g., a semiconductor wafer) to form a resist layer 106. The spin-coating apparatus 100 consists of a coater cup 108 and a rotating platform 110 (e.g., a vacuum chuck) positioned at the center of the coater cup 108 for supporting the substrate 104. The rotating platform 110 can be rotated by a shaft 112, which is connected to an electric motor (not shown). The coater cup 108 is provided with a spent resist drain pipe 114. The spent resist drain pipe 114 is used to drain away resist material 102 that spun off the substrate 104 during a coating operation.

During the operation of the spin-coating apparatus 100 of FIG. 1, the rotating platform 110 is first loaded with the substrate 104 on its top. A dispenser 116 then approaches the center of the substrate 104 and applies a predetermined amount of a resist material 102 to the center of the substrate 104. In various embodiments, the resist material 102 is in a liquid form. The rotating platform 110 then spins to spread out the resist material 102 to evenly cover the top surface of the substrate 104. Extra resist material 102 is thrown off the substrate surface and drained away by the spent resist drain pipe 114.

Figure 2:
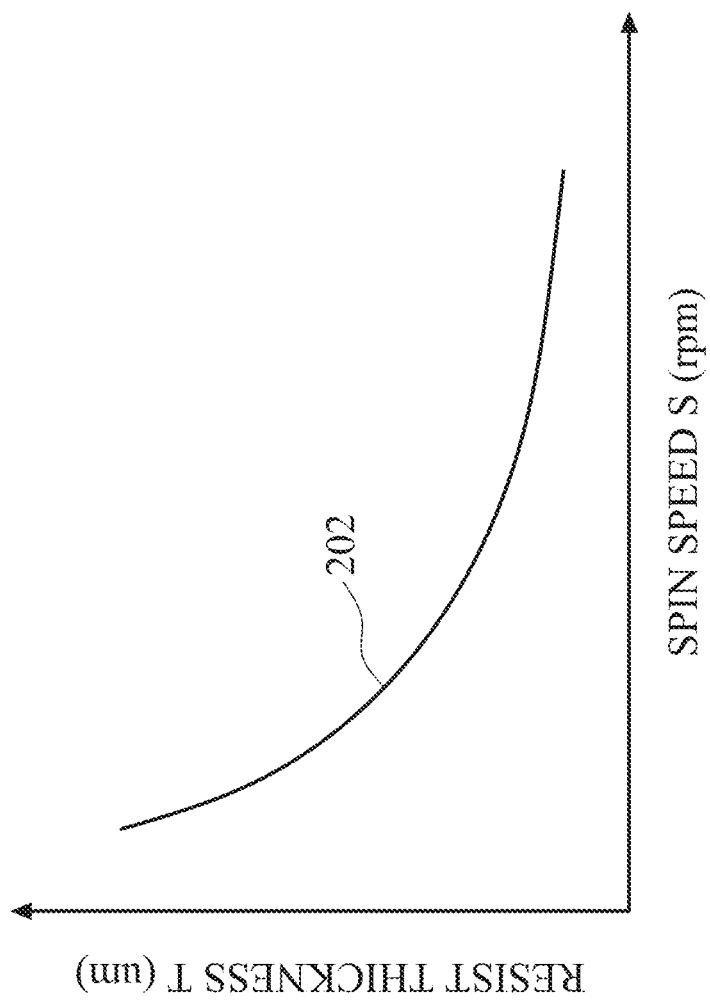
FIG. 2 illustrates a graph showing a resist layer thickness as a function of spin speed during spin coating a resist layer, according to aspects of the present disclosure.

The varying resist layer thickness (denoted as "T") on the substrate 104 is achieved by varying the spin speed (denoted as "S") of the rotating platform 110 during resist coating or deposition. Referring to FIG. 2, the variations in the resist layer thickness T along the Y-axis are plotted as a function of the spin speed S in revolutions per minute (rpm) along the X-axis, as depicted by the curve 202. The resist material viscosity (denoted as "centi-Pose," or "cP") is another factor that affects the resist layer thickness T. Appropriate viscosity cP is needed to reach target thickness and uniformity. The relationship between the resist layer thickness T, the spin speed S, and the viscosity cP can be approximately expressed by a formula $S^2*T*cP=k$, wherein k is a constant. This formula shows the reversed relationship between the resist layer thickness T and the spin speed S. With the same resist material (i.e., cP is fixed), faster the spin speed S, thinner the resist layer thickness T is achieved, and vice versa.

Referring back to FIG. 1, an optical detector 130 is installed adjacent to the resist layer 106 with a distance. The optical detector 130 is configured to detect the thickness of the resist layer 106 in an area below the thickness detector 130. In the illustrated embodiment, the optical detector 130 includes a light emitter 132 and an optical receiver 134. The light emitter 132 emits a light 136 onto the surface 118 of the resist layer 106. The light 136 is thus reflected by the surface 118 and subsequently received by the optical receiver 134. In some embodiments, the light emitter 132 emits light with visible components (e.g., lights in the visible spectrum), such as white light that comprises a combination of lights in different colors. In some embodiments, the light emitter 132 emits light in a monotone color, such as one of the primary colors (e.g., red, blue, or green). In some embodiments, the light emitter 132 emits light outside of the visible spectrum, such as light in infrared wavelengths or in ultraviolet wavelengths. In yet some embodiments, the light emitter 132 includes a laser source emitting a laser beam 136.

The optical receiver 134 is configured to be sensitive to the wavelengths of the light 136. The optical receiver 134 records the strength of the light 136 reflected from a region below the optical detector 130. The strength of the light 136 is also referred to as the light intensity measured in candela. In some embodiments, the optical receiver 134 is a charge-coupled device (CCD). In some embodiments, the optical detector 130 is not equipped with a light emitter 132. For example, the CCD is able to capture an image of the surface 118 with ambient lights, without the aid of a light emitter 132. In some embodiments, the optical detector 130 is a confocal laser scanning microscopy (CLSM) or a vertical scanning optical interferometry (VSOI).

The optical detector 130 is able to move along a rack or a rail system (not shown) hang above the surface 118 and conduct either surface scan or line scan. An arrangement for the scan pattern is adopted if a predetermined location on the surface 118 is required to be scanned and detected. In some embodiments, the optical detector 130 first finishes scanning of a strip along the X direction of the surface 118, then steps a distance along the Y direction to finish scanning of an adjacent strip along the X direction, and then repeats movement in a zig-zag pattern to sweep a continuous area of the surface 118. In some embodiments, the optical detector 130 can further move along the Z direction to adjust the height or tilt an angle with respect to a normal direction of the surface 118. The optical receiver 134 collects the optical signal reflected from the surface 118 during the scanning. The thickness profile of the resist layer 106 is measured through the reflected optical signal, which will be explained in further details later on.

The optical detector 130 further has a converter (not shown) to convert the analog optical signals into electrical signals. In some embodiments, the converter is built in the optical detector 130. The converter is coupled with a processor 140 which stores an algorithm to process the electrical signals for determining a thickness value of the location detected. In some embodiments, the processor 140 is in communication with a controller 142. The controller 142 may be part of the apparatus 100 or as a production management system (PMS) outside of the apparatus 100. The optical detector 130 operates in accordance with the commands from the controller 142. For example, the optical detector 130 receives an order from the controller 142 to adjust an angle or location to capture the image of a predetermined location of the surface 118.

The optical detector 130 is integrated in the apparatus 100 and the scanning operation is performed under a real-time mode without switching the apparatus 100 offline. For example, the optical detector 130 is able to scan the surface 118 in-situ while the substrate 104 is still loaded on the rotating platform 110. An in-line thickness profile is generated without interrupting the apparatus 100. Therefore, the optical detector 130 is able to perform a real-time thickness monitoring while the substrate 104 is just finished coating or a baking process after coating. In some embodiments, the spin-coating process can have intervals between rotation periods which allow the optical detector 130 to scan a still surface 118 and feedback thicknesses at one or more predetermined locations real time through the controller 142 to the apparatus 100 to adjust the spin speed when the rotation period continues. The controller 142 may further communicate with other semiconductor manufacturing apparatus, for example, with a lithographic etcher to adjust etching rate settings in advance based on the thickness profile.

In some embodiments, the optical detector 130 is configured to perform a full scan or a local scan. For the full scan, the optical detector 130 catches an image of the whole area of the surface 118. For the local scan, the optical detector 130 only catches one or more predetermined zones on the surface 118. The processor 140 is coupled with the optical detector 130 and is able to process the caught image and recognize different zones on the surface 118. The processor 140 calculates the thickness of each zone according to the reflected optical signal strength caught by the optical detector 130. Furthermore, the image acquired by the full scan or the local scan can also be processed by the processor 140 for defect detection. A defect 120 may include dust, air bubble, or metal impurities disposed in the resist layer. The defect 120 can cause issues when the resist layer is developed. The processor 140 is also configured to optically identify the defect 120 from the acquired image. In some embodiments, the processor 140 is built in the optical detector 130 as an integrated component.

Figure 3B:
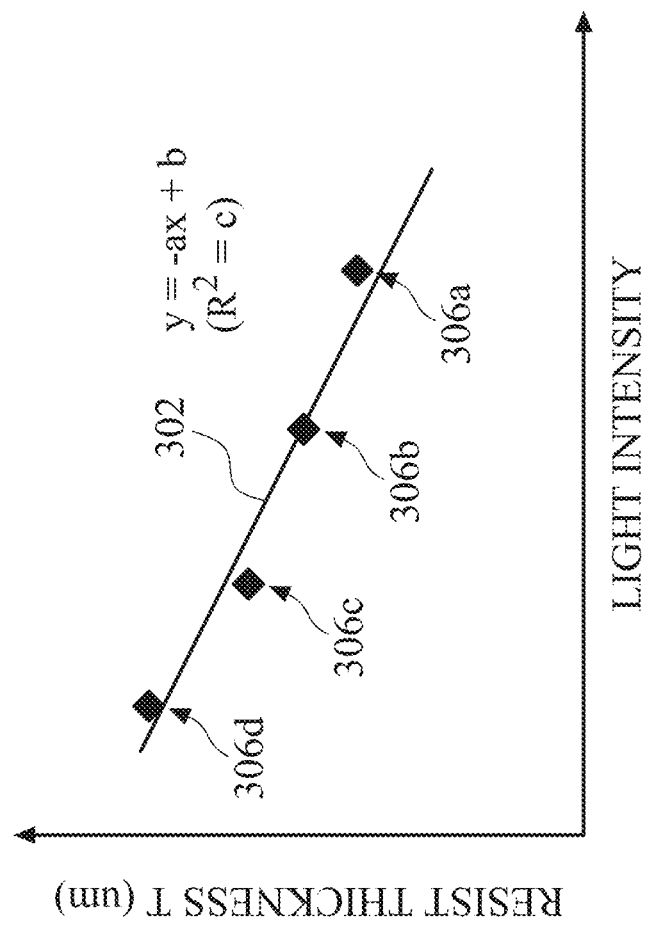
FIGS. 3A and 3B illustrate correlating resist layer thickness to light intensity by measuring a series of monitor wafers, in accordance with some embodiments.
Figure 3A:
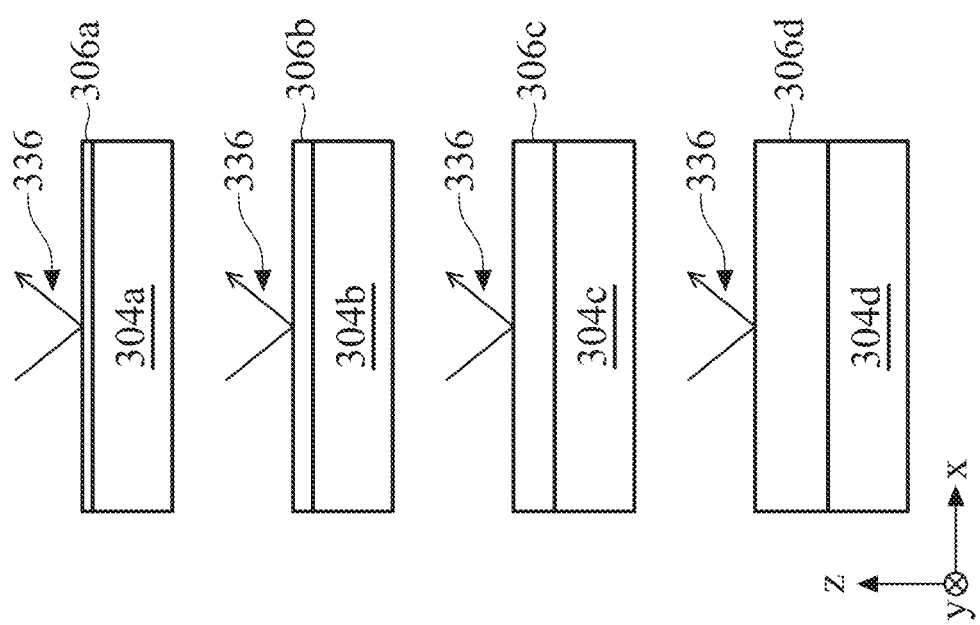

When an incident light reflects away from a resist layer, the light is modulated by the resist layer which changes the reflected light intensity. The reflected light intensity is correlated with the resist layer thickness and other resist material optical properties including refractive index. Different resist materials have different correlations between the resist layer thickness and the reflected light intensity. Therefore, by determining the correlation of a certain resist material, the resist layer thickness can be determined by acquiring the knowledge of the reflected light intensity. FIGS. 3A and 3B illustrate reflected light intensity measurement results versus predetermined resist layer thicknesses on a series of substrates 104 in a specific embodiment.

Referring to FIG. 3A, a series of monitor wafers 304 (e.g., wafers 304a-d) are coated with a series of resist layers 306 (e.g. resist layers 306a-d) of different thicknesses, respectively. The thickness of each resist layer 306 in a predetermined region, such as a center of a monitor wafer, has been determined by a metrological method, such as by a constant-angle reflection-interference spectrometer (CARIS). A light 336 of a certain wavelength, such as visual light, or more specifically a light in a primary color, is projected on the predetermined region and subsequently reflected away. The intensity of the reflected light 336 from each monitor wafer is recorded by an optical detector.

Referring to FIG. 3B, by marking each monitor wafer's pair of resist layer thickness and respective reflected light intensity in a coordinate axes plot (e.g., the illustrated diamond markers denoted with corresponding resist layer numerals), the inventors have observed a line 302 can be generated in a regression process to correlate with the resist thickness versus light intensity. The line 302 can be represented by a polynomial function. In the illustrated embodiment, the polynomial function is a first-degree polynomial function, and the line 302 is a linear line. The first-degree polynomial function can be expressed as y=−ax+b, wherein x and y are reflected light intensity and resist layer thickness, respectively. How well the line 302 fits with the series of illustrated diamond markers can be measured by the coefficient of determination ($R^2$) of the polynomial function. In some embodiments, the polynomial function is a second-degree polynomial function or even a higher degree polynomial function. The polynomial function represents the relationship between a resist layer thickness and a reflected light intensity. Once a polynomial function is determined, a resist thickness can be calculated by applying measured reflected light intensity as a variable into the polynomial function.

Figure 4:
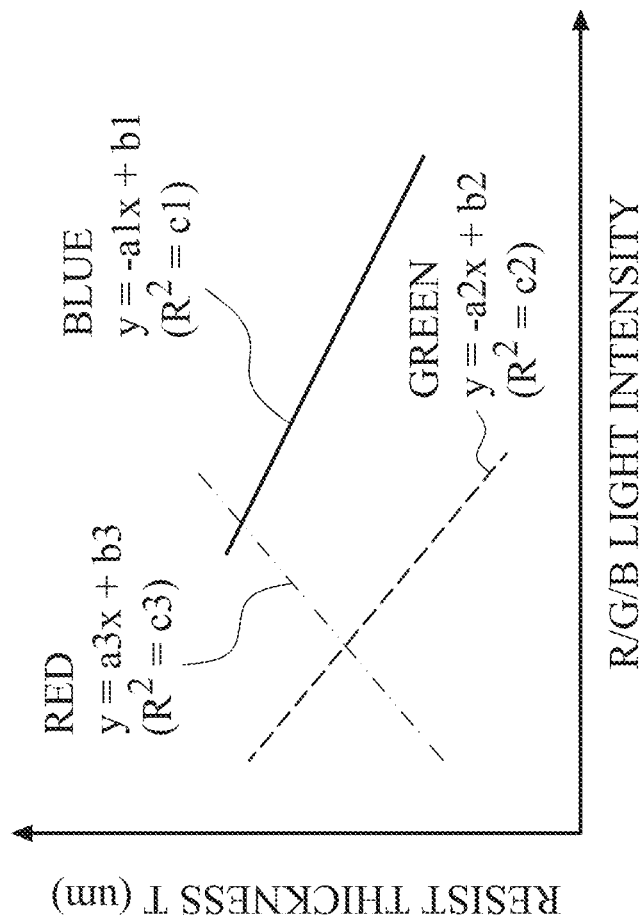
FIG. 4 illustrates a series of first-degree polynomial functions corresponding to correlations of resist layer thickness and R/G/B light intensity, in accordance with some embodiments.

For the same resist material, if the wavelength of the light is different, the regressed polynomial function varies too. FIG. 4 illustrates a series of polynomial function regressed after imaging the monitor wafers with white light and retrieving primary colors (e.g., red, blue, and green) intensities from the captured image. Each polynomial function corresponding to respective primary color has a different slop and a different coefficient of determination ($R^2$). Depending on the wavelength, the slop can be a positive value or a negative value. Some polynomial functions correlate with the thickness versus light intensity relationship better (i.e., a higher $R^2$) than other polynomial functions.

Figure 5:
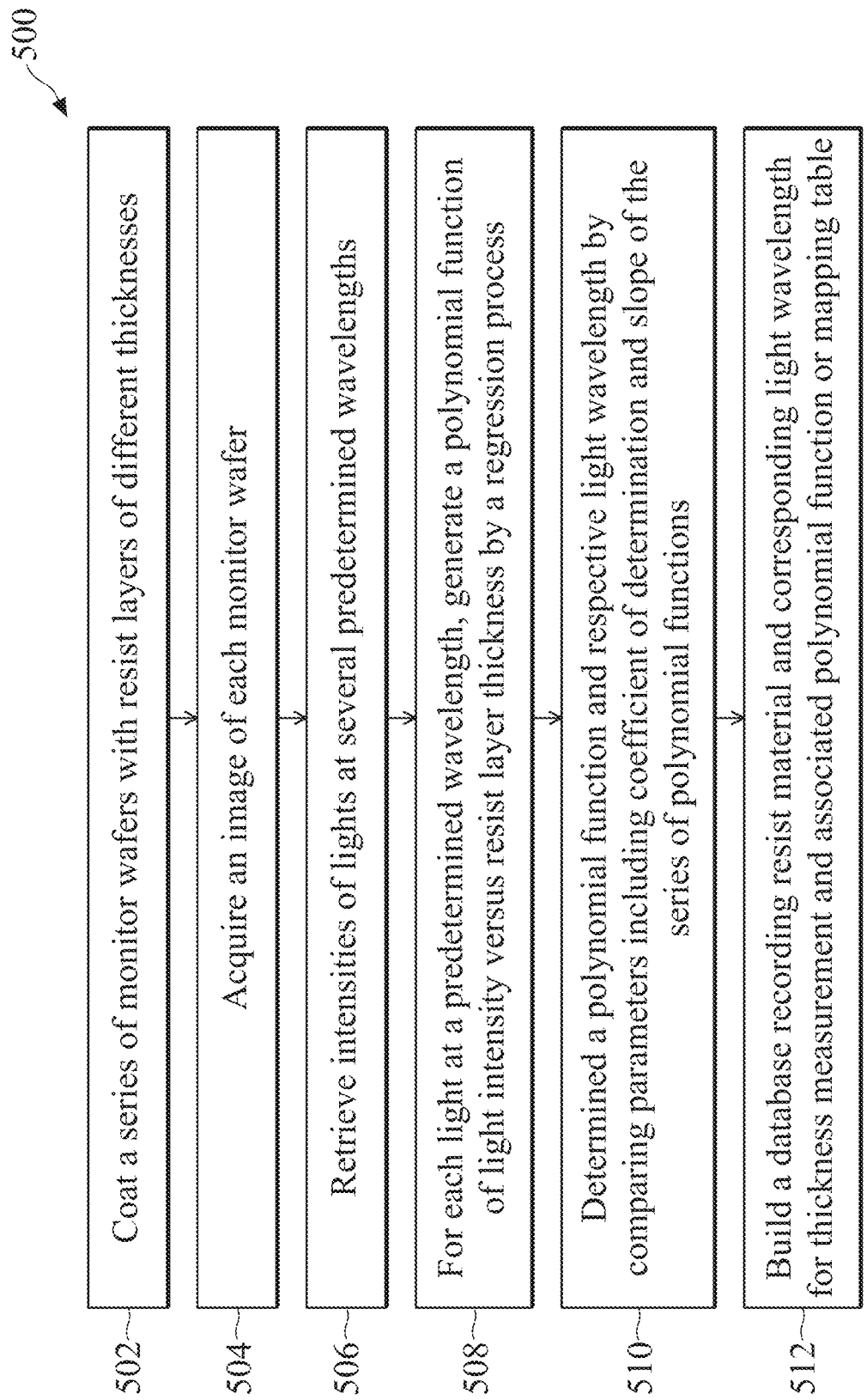
FIG. 5 illustrates a method of creating a database that records resist material and corresponding light wavelength for thickness measurements and associated polynomial function or mapping table, according to aspects of the present disclosure.

FIG. 5 illustrates a flow chart of a method 500 for picking a polynomial function and building a database recording such information in accordance with an embodiment. The method 500 is merely an example, and is not intended to limit the present disclosure beyond what is explicitly recited in the claims. Additional operations can be provided before, during, and after the method 500, and some operations described can be replaced, eliminated, or moved around for additional embodiments of the method. The method 500 is described below in conjunction with FIGS. 3A-6B.

At operation 502, the method 500 coats a series of monitor wafers 304 with the same resist material to form resist layers 306 of different thicknesses, as shown in FIG. 3A. In one embodiment, operation 502 coats five or seven monitor wafers with resist layer thicknesses in a range of about 1±3% of a median thickness. In a furtherance of the embodiment, operation 502 coats five monitor wafers with a median thickness of about 200 nm, among which the five different resist layer thicknesses include 194 nm ((1-3%)× 200 nm), 197 nm ((1−1.5%)×200 nm), 200 nm, 203 nm ((1+1.5%)×200 nm), and 206 nm ((1+3%)×200 nm).

At operation 504, the method 500 captures an image of each monitor wafer 304 with an optical detector. To image the monitor wafer 304, operation 504 may illuminate the monitor wafer 304 with an incident light 336, as shown in FIG. 3A. The incident light 336 may be generated by one or more LED diodes. In some embodiments, the incident light 336 is white light or monotone light of a primary color. In some embodiments, operation 504 does not illuminate the monitor wafer 304 but uses ambient light instead.

At operation 506, the method 500 retrieves intensities of light at several predetermined wavelengths. If a monotone light, such as blue light, is used at operation 504, then the intensity recorded by the optical detector can be directly used. If the light used at operation 504 comprising components at different wavelengths, such as white light, light in other colors covering a portion of the visible spectrum, or ambient light, the components at predetermined wavelengths are retrieved from the light and respective intensities are recorded. For example, three sub-images of primary colors, such as red, blue, and green, can be retrieved or decomposed from a captured image taken by illuminating with white light or ambient light.

At operation 508, the method 500 generates a polynomial function of light intensity versus resist layer thickness for lights at each predetermined wavelength. In some embodiments, polynomial functions are generated in a regression process which correlates relationships of the series of resist layer thicknesses and respective reflected light intensities at different wavelengths. After operation 508, a series of polynomial functions are created.

At operation 510, the method 500 examines the series of polynomial functions generated by operation 508 and determines which polynomial function most accurately fit the relationship between resist layer thickness and light intensity. In a specific embodiment, lights of primary colors are recorded at operation 506, as shown in FIG. 4, in which blue light polynomial function has an $R^2$ about 0.99 and a slope about −1.6, green light polynomial function has an $R^2$ about 0.97 and a slope about −2.3, and red light polynomial function has an $R^2$ about 0.66 and a slope about 3.8. Operation 510 compares $R^2$ values and picks the polynomial function with the largest $R^2$ value, such as the blue light polynomial function with an $R^2$ about 0.99. If multiple polynomial function has the same $R^2$, operation 510 further compares absolute slope values and picks the polynomial function with the largest absolute slop value. Alternatively, operation 510 can set a threshold of a predetermined $R^2$ value, and then picks a polynomial function with the largest absolute slope value from ones satisfying $R^2$ larger than the threshold. In the specific embodiment given above, if the threshold is set at $R^2 > 0.96$, then operation 510 will first remove red light polynomial function from further consideration ($R^2 = 0.66$), then picks green light polynomial function which has the largest absolute slope value (2.3>1.6).

At operation 512, the method 500 creates a database to record the resist material and corresponding light wavelength (or light color) for thickness measurement. Operation 512 also records the polynomial function associated with this light wavelength. An illustrative database is shown in FIG. 6A. The database can be searched by resist material name as an index. Each resist material has an entry about which light wavelength (or light color) is recommended to use for thickness measurement and a corresponding polynomial function. The light wavelength and the polynomial function are determined previously through operations 502 to 510. By applying the polynomial function to a measured reflected light intensity, the resist layer thickness can be calculated. Alternatively, the database may also include a mapping table as shown in FIG. 6B. The mapping table stores entries of the pair of light intensity and respective thickness, which can be directly recorded from measurements or from a calculation using the polynomial function. By using light intensity as an index, the corresponding resist layer thickness can be looked up from the mapping table. To add a new resist material to the database, the method 500 will create a new series of monitor wafers coated with the new resist material and then repeat operations 502 to 510, to find out suitable light wavelength (or light color) for most accurate thickness measurement and a corresponding regressed polynomial function.

Figure 7:
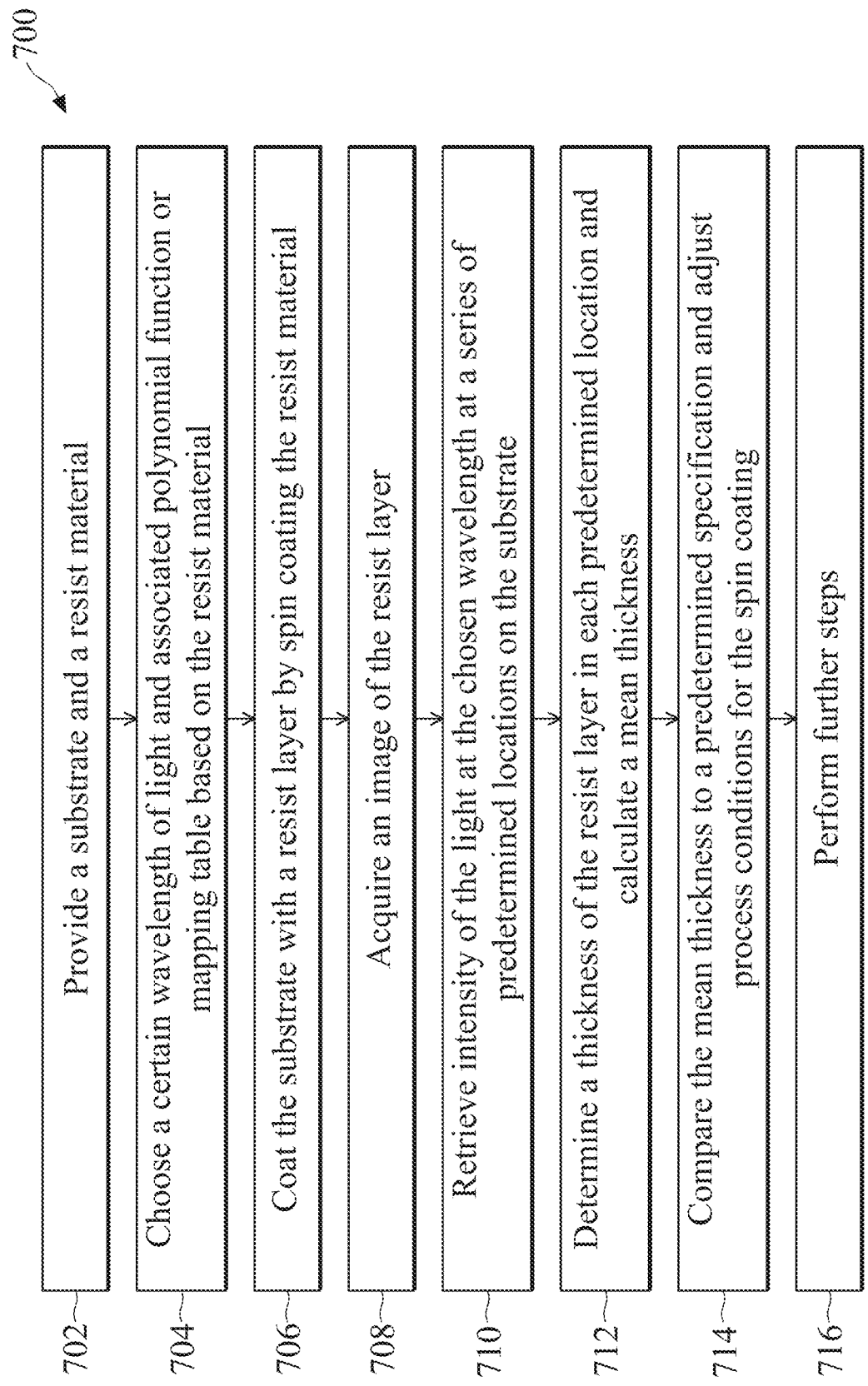
FIG. 7 illustrates a method of adjusting spin-coating process conditions by measuring resist layer thickness, according to aspects of the present disclosure.

FIG. 7 illustrates a flow chart of a method 700 for coating a substrate with a resist layer, while taking measurements of the resist layer thickness in-situ and feeding back to the apparatus to adjust process conditions, such as spin speed, to achieve a different resist layer thickness. The method 700 is merely an example, and is not intended to limit the present disclosure beyond what is explicitly recited in the claims. Additional operations can be provided before, during, and after the method 700, and some operations described can be replaced, eliminated, or moved around for additional embodiments of the method.

At operation 702, the method 700 provides, or receives, a substrate 104 and a resist material 102 to coat on the substrate 104, as shown in FIG. 1. At operation 704, the method 700 uses the resist material as an index to look up from a database, such as the one illustrated in FIG. 6A, a light of a certain wavelength or color for subsequent thickness measurement. Together, an associated polynomial function or mapping table is retrieved at operation 704.

At operation 706, the method 700 coats the substrate 104 with a resist layer 106, as shown in FIG. 1. The coating process includes using a spin-coating apparatus 100 which rotates the substrate 104 at a certain speed while dispensing the resist material 102 thereon to form the resist layer 106. In some embodiments, operation 706 includes a baking process in-situ after the coating process.

The substrate 104 may be a semiconductor substrate, such as a silicon wafer, in some embodiments. Alternatively, the substrate 104 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 104 includes indium tin oxide (ITO) glass. The substrate 104 may further include one or more material layers to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. In some embodiments, the substrate 104 includes fin active regions and three-dimensional fin field-effect transistors (FinFETs) formed or to be formed thereon. In some other embodiments, a top portion of the substrate 104 includes one or more layers of a tri-layer resist stack, such as an underlayer of a tri-layer resist stack or an underlayer and a middle layer of a tri-layer resist stack.

The resist layer 106 (e.g., 306a-d in FIG. 3A) is deposited above the substrate 104 as a blanket layer. In some embodiments, the resist layer 106 is a layer of a tri-layer resist stack. For example, the resist layer 106 may be an underlayer of a tri-layer resist stack. The underlayer functions as a mask to protect the substrate 104 from etching or ion implantation. Accordingly, the underlayer has a sufficient thickness to achieve this. In some embodiments, the underlayer includes organic polymers. In one example, the underlayer comprises a Spin-On Carbon (SOC) material. In one example, the underlayer comprises a novalac resin. The formation of the underlayer may include spin-on coating and baking process.

Alternatively, the resist layer 106 may be a middle layer of a tri-layer resist stack. Correspondingly, a topmost portion of the substrate 104 includes an underlayer of the respective tri-layer resist stack. The middle layer is the second layer of the tri-layer resist. The middle layer may be a silicon-containing layer designed to provide etch selectivity from the underlayer. In some embodiments, the middle layer functions as an etch mask to transfer a pattern to the underlayer. In some embodiments, the middle layer 114 is also designed to function as a bottom anti-reflective coating that reduces reflection during a lithography exposure process, thereby increasing the imaging contrast and enhancing the imaging resolution. In some embodiments, the formation of the middle layer includes spin-on coating and baking process.

Alternatively, the resist layer 106 may be a top layer of a tri-layer resist stack. Correspondingly, a topmost portion of the substrate 104 includes a middle layer and an underlayer of the respective tri-layer resist stack. The top layer may be a photosensitive layer. The photosensitive layer may include a photosensitive chemical, a polymeric material, and a solvent. In some embodiments, the photosensitive layer utilizes a chemical amplification (CA) resist material. For example, a positive CA resist material includes a polymer material that turns soluble to a developer such as a base solution after the polymeric material is reacted with acid. Alternatively, the CA resist material can be negative and include a polymer material that turns insoluble to a developer such as a base solution after the polymer is reacted with acid. The formation of the photosensitive layer may include spin-on coating and baking process.

Figure 8:
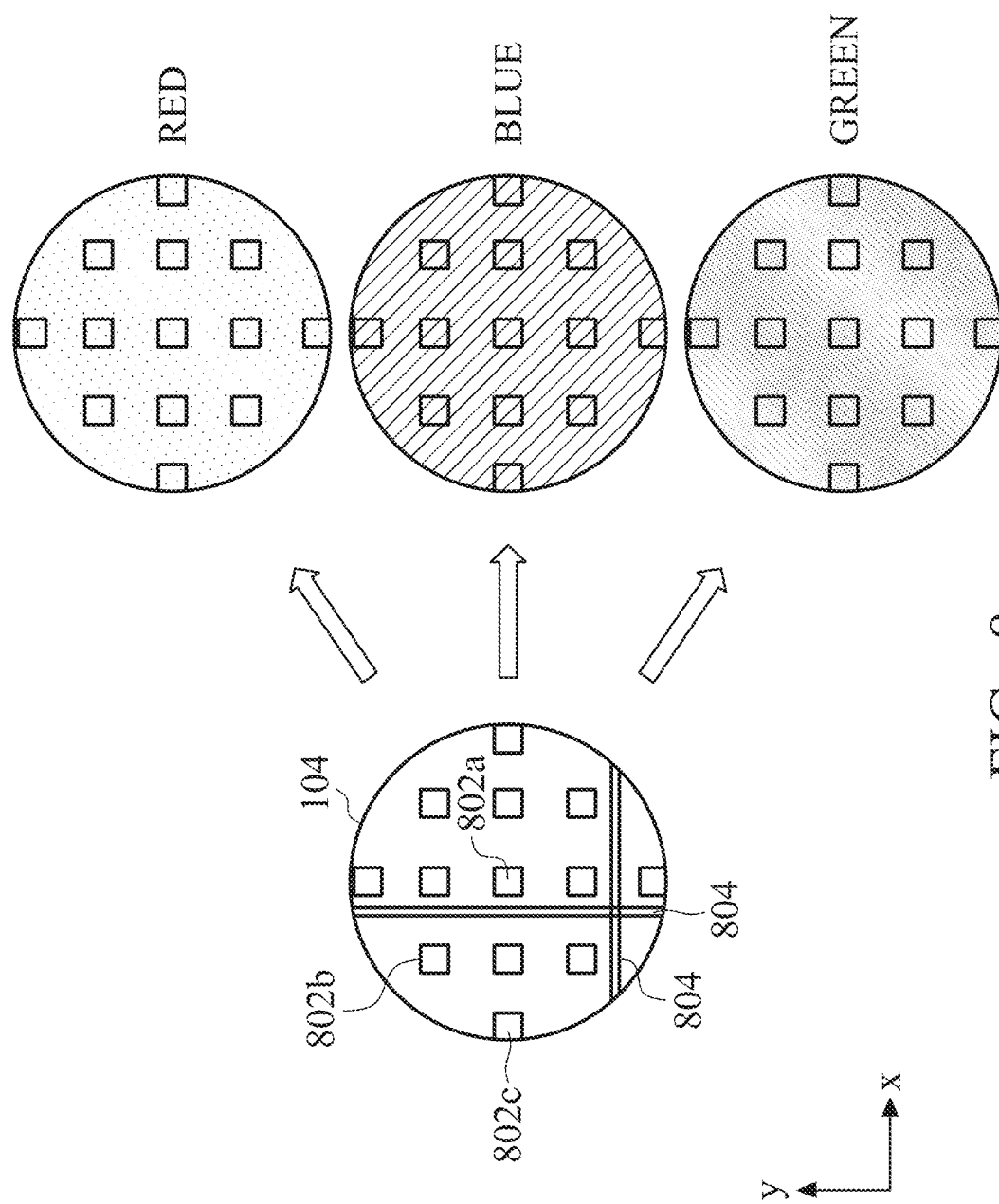
FIG. 8 illustrates retrieving light intensity of primary colors from an image of a semiconductor wafer according to the method of FIG. 7, in accordance with some embodiments.

At operation 708, the method 700 captures a surface image of the resist layer 106 by using the optical detector 130. Operation 708 may include illuminating the resist layer 106 with a light of a certain wavelength (or a specific color) recorded in the database 600. Alternatively, operation 708 may use white light or merely ambient light to capture the image. Because the optical detector 130 is integrated in the spin-coating apparatus 100, the detection is under an in-situ mode without human intervention. The location to-be-detected on the resist layer 106 is predetermined by the processor 140. In some embodiments, the predetermined location includes a center zone 802a, a plurality of edge zones 802c, and a plurality of middle zones 802b therebetween, as shown in FIG. 8. In some embodiments, each zone corresponds to one pixel of the image. For a specific example, in a whole wafer image of 2048×2048 pixels, each pixel may represent a zone about 159 um×159 um. In many embodiments, a zone about 159 um×159 um may provide decent coverage such that larger than that may result in lower accuracy and less than that may increase calculation complexity. In some embodiments, the optical detector 130 only captures snapshot image at the predetermined locations. In some embodiments, the optical detector 130 captures an image of the whole wafer 104 in a zig-zag sweeping pattern. The image is transmitted to the processor 140 to recognize the predetermined locations. The processor 140 sets the zones away from scribe streets 804 on the wafer 104, since scribe streets disturb reflected lights and cause inaccuracy. In some embodiments, the processor 140 is built in the optical detector 130, and the image transferring is performed inside the optical detector 130 without any external wire or wireless router.

At operation 710, the method 700 retrieves from the image intensity of the light at the chosen wavelength (or the specific color) from the predetermined locations. For example, each pixel of the image can be decomposed into a combination of three primary colors (e.g., red, blue, and green). Therefore, the image can be represented by three sub-images of red, blue, and green. If the database 600 has indexed the resist material with blue light, then the sub-image of blue will be examined by the processor 140 in the predetermined locations to retrieve blue light intensities, while the other two sub-images of red and green may be discarded.

At operation 712, the method determines a thickness of the resist layer in each predetermined location. The thickness value in each predetermined location is also referred to as a localized thickness. In some embodiments, the processor 140 calculates the thickness value in the predetermined locations by applying a respective polynomial function to the light intensity. The polynomial function is associated with the resist material, which can be looked up by searching the resist material as an index in the database similar to the one illustrated in FIG. 6A. In some alternative embodiments, the processor 140 directly looks up the resist thickness corresponding to the light intensity from a mapping table similar to the one illustrated in FIG. 6B, without a need to calculate from a polynomial function. In some embodiments, predetermined location recognition and thickness determination are performed simultaneously in the processor 140. Then the processor 140 calculates a mean thickness by averaging the localized thicknesses. In some embodiments, each localized thickness has the same weight during the averaging process. In some other embodiments, localized thicknesses have different weights. For example, thicknesses near center of a wafer may be more uniform than peripherals of a wafer and thus more accurate for measurements near center, a center zone 802a may accordingly have a higher weight than a middle zone 802b, while the edge zone 802c has the least weight.

Figure 9:
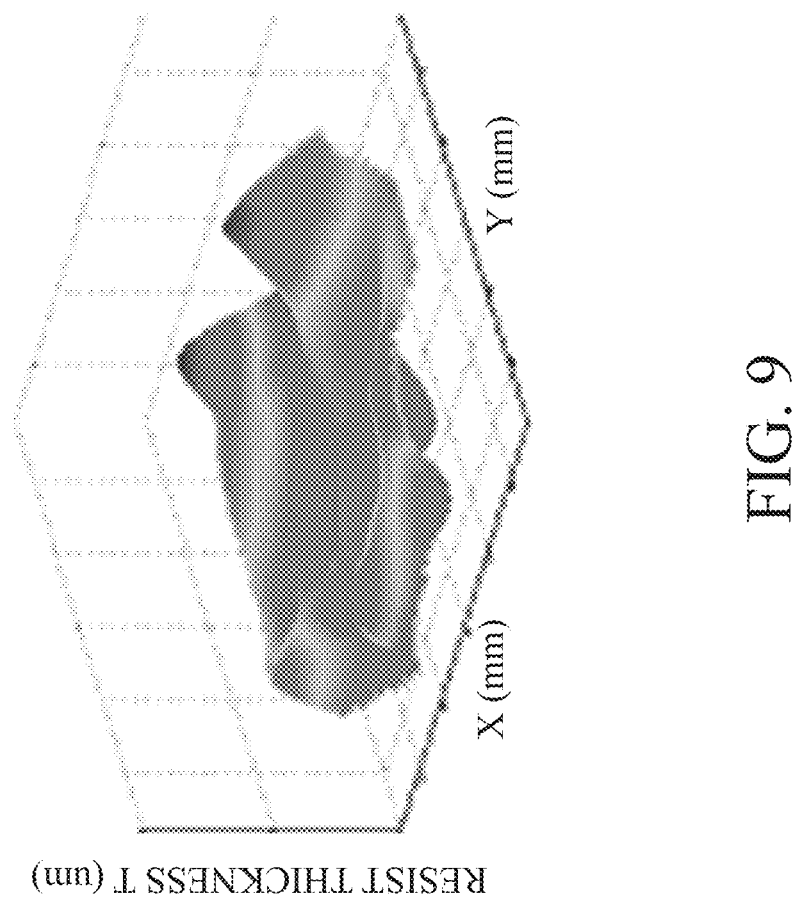
FIG. 9 illustrates generating a global thickness map at a wafer scale according to the method of FIG. 7, in accordance with an embodiment.

Furthermore, since the predetermined locations are spread out in the wafer 104, a global thickness map can be generated, as shown in FIG. 9. The thicknesses of regions outside of the predetermined locations can be calculated by an interpolation of adjacent predetermined locations' thicknesses. By examining thickness values in different regions on the wafer, the processor 140 can also calculate thickness uniformity or thickness variance at the wafer level.

The method 700 continues with operation 714 in which the mean thickness calculated in operation 712 is compared with a predetermined specification. The predetermined specification is defined for a threshold value of resist layer thickness. When the mean thickness calculated is larger or less than the predetermined specification, the controller 142 sends command(s) to the apparatus 100 to adjust process conditions for the spin coating (e.g., for the next wafer), such as the spin speed, resist material dispensing amount, and/or baking temperature curve. In some embodiments, if the mean thickness is larger than the predetermined specification, the rotating platform 110 will be set to a higher spin speed; if the mean thickness is less than the predetermined specification, the rotating platform 110 will be set to slower spin speed. The adjusted speed may be applied to the next wafer loaded into the apparatus 100 or applied to the same wafer currently in the apparatus 100 (e.g., to add more resist to increase thickness). By this means, the resist layer thickness can be accurately controlled. The controller 142 may also send the mean thickness to other semiconductor manufacturing apparatus, for example, with a lithographic etcher to adjust etching rate settings in advance based on the thickness profile of the current wafer.

At operation 716, the method 700 performs further steps to continue the semiconductor device fabrication. For example, the method 700 may coat another resist layer with a different resist material, such as a higher layer of the tri-layer resist stack. The method 700 will repeat operations 702 to 714 to retrieve from the database a light possibly at a different wavelength (or different color) and respective polynomial function to determine new resist layer's thickness. In another example, the method 700 delivers the wafer 104 to the next semiconductor manufacturing apparatus, such as a lithographic etcher for etching process to eventually form a complete IC.

Although not intended to be limiting, one or more embodiments of the present disclosure provide many benefits to a semiconductor device and the formation thereof. For example, embodiments of the present disclosure provide a semiconductor apparatus and a fabrication method to accurately control resist layer thickness during the semiconductor device fabrication, which increases CDs uniformity in the final products. Furthermore, the method for monitoring and feedback controlling resist layer thickness can be easily integrated into existing semiconductor fabrication processes.

In one exemplary aspect, the present disclosure is directed to a method. The method includes forming a material layer over a substrate; illuminating at least one region of the material layer with a light; recording strength of the light reflected from the at least one region; and determining a thickness of the material layer in the at least one region according to the strength of the light. In some embodiments, the forming of the material layer and the illuminating of the at least one region of the material layer is in-situ. In some embodiments, the recording of the strength of the light is performed by a charge-coupled device (CCD). In some embodiments, the CCD is also configured to detect a defect in the material layer. In some embodiments, each pixel of the CCD corresponds to about 159 um×159 um surface area in a plan view of the substrate. In some embodiments, the light has a visible color. In some embodiments, the determining of the thickness of the material layer includes applying a polynomial function to the strength of the light. In some embodiments, the polynomial function is a first degree polynomial function. In some embodiments, the first degree polynomial function has a negative slope. In some embodiments, the substrate is a semiconductor wafer. In some embodiments, the at least one region does not overlap with a scribe street of the semiconductor wafer. In some embodiments, the method further includes adjusting process conditions for the forming of the material layer by comparing the thickness to a threshold value.

In another exemplary aspect, the present disclosure is directed to a method. The method includes coating a resist layer over a substrate; scanning a plurality of areas of the resist layer, wherein the scanning includes: imaging the plurality of areas; and recording strength of a reflected light in each of the plurality of areas during the imaging of the plurality of areas; calculating a mean thickness of the resist layer using the recorded strength; and adjusting process conditions for the coating of the resist layer based on the mean thickness. In some embodiments, the scanning further includes sweeping a charge-coupled device (CCD) above the substrate. In some embodiments, the calculating of the mean thickness includes: determining a plurality of thicknesses corresponding to the plurality of areas using the recorded strength; and averaging the plurality of thicknesses as the mean thickness. In some embodiments, the determining of the plurality of thicknesses includes looking up each of the plurality of thickness from a mapping table that uses the recorded strength as an index. In some embodiments, the adjusting of the process conditions includes adjusting a spinning speed of a spin-coating device that is configured to coat the resist layer.

In yet another exemplary aspect, the present disclosure is directed to a method of semiconductor manufacturing. The method includes forming a resist layer over a substrate with a spin-coating process; catching an image of the resist layer, the image including a plurality of predetermined locations of the resist layer; retrieving strength of a color from the image in each of the plurality of predetermined locations; calculating a plurality of thicknesses corresponding to the plurality of predetermined locations based on the strength of the color; generating a mean thickness by averaging the plurality of thicknesses; and adjusting a spinning speed of the spin-coating process according to the mean thickness. In some embodiments, the color is a prime color. In some embodiments, the calculating of the plurality of thicknesses includes applying a polynomial function to the strength of the color, and wherein the generating of the polynomial function includes retrieving strength of the color from images of a plurality of monitor wafers coated with resist layers of various thicknesses, respectively.

The foregoing outlines features of several embodiments so that those ordinarily skilled in the art may better understand various aspects of the present disclosure. Those ordinarily skilled in the art should appreciate that they may readily use the present disclosure as a basis for designing or modifying other processes and structures for carrying out the same or similar purposes and/or achieving the same or similar advantages disclosed herein. Those ordinarily skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a plurality of monitor wafers;
coating the plurality of monitor wafers with a plurality of coating layers of different thicknesses, respectively, wherein the plurality of coating layers are formed of a first coating material;
illuminating each of the plurality of coating layers with a first visible light to obtain a first plurality of light intensities reflected from the plurality of coating layers, respectively;
illuminating each of the plurality of coating layers with a second visible light to obtain a second plurality of light intensities reflected from the plurality of coating layers, respectively, the second visible light being different from the first visible light;
generating, based on the first plurality of light intensities and the plurality of coating layers of different thicknesses, a first polynomial function associated with the first coating material and the first visible light;
generating, based on the second plurality of light intensities and the plurality of coating layers of different thicknesses, a second polynomial function associated with the first coating material and the second visible light;
in response to a coefficient of determination of the first polynomial function being greater than a coefficient of determination of the second polynomial function, recording the first visible light and the first polynomial function as being usable for detecting a thickness of a material layer formed of the first coating material for actual semiconductor fabrication process;
creating a database comprising at least a first entry and a second entry, wherein the first entry records the first coating material, the first visible light in association with the first coating material, and the first polynomial function associated with both the first coating material and the first visible light, wherein the second entry records a second coating material, the second visible light in association with the second coating material, and a third polynomial function associated with both the second coating material and the second visible light, wherein the second coating material is different from the first coating material, and the first polynomial function is different from the third polynomial function;
after creating the database, forming a material layer over a substrate with a coating material selected from one of the first and second coating materials;
in response to the first coating material being selected to form the material layer, retrieving the first entry and selecting the first visible light for detecting a thickness of the material layer;
illuminating at least one region of the material layer with a light comprising the first visible light;
recording a strength of the first visible light reflected from the at least one region; and
determining a thickness of the material layer in the at least one region by computing the first polynomial function, the first polynomial function having a single variable, wherein the single variable is the strength of the first visible light.

2. The method of claim 1, wherein the forming of the material layer and the illuminating of the at least one region of the material layer is in-situ.

3. The method of claim 1, wherein the recording of the strength of the first visible light is performed by a charge-coupled device (CCD).

4. The method of claim 3, wherein the CCD is also configured to detect a defect in the material layer.

5. The method of claim 1, wherein at least one of the first and second polynomial functions is a second degree polynomial function.

6. The method of claim 1, wherein at least one of the first and second polynomial functions is a first degree polynomial function with a negative slope.

7. The method of claim 1, further comprising:
adjusting process conditions for the forming of the material layer by comparing the thickness to a threshold value.

8. The method of claim 1, wherein the light includes a mixture of the first visible light and the second visible light.

9. The method of claim 8, wherein the recording of the strength of the first visible light including retrieving the strength of the first visible light from a strength of the light.

10. The method of claim 1, wherein the light includes the first visible light but is free of the second visible light.

11. The method of claim 1, wherein the forming of the material layer includes intervals, and the illuminating the at least one region of the material layer with the light, the recording of the strength, and the determining of the thickness of the material layer are performed during one or more of the intervals.

12. The method of claim 1, further comprising:
under a condition that both the coefficient of determination of the first polynomial function and the coefficient of determination of the second polynomial function are greater than a predetermined threshold, selecting the first visible light and the first polynomial function as being usable for detecting a thickness of a coating layer formed of the first coating material if an absolute slope of the first polynomial function is greater than an absolute slope of the second polynomial function.

13. A method, comprising:
forming a plurality of coating layers of different thicknesses over a plurality of monitor wafers, respectively, wherein the plurality of coating layers are formed of a first coating material;
imaging each of the plurality of coating layers with a first light to obtain a first plurality of light intensities reflected from the plurality of monitor wafers, respectively;
imaging each of the plurality of coating layers with a second light to obtain a second plurality of light intensities reflected from the plurality of monitor wafers, respectively, the second light being different from the first light;
generating, based on the first plurality of light intensities and thicknesses of the plurality of coating layers, a first polynomial function associated with the first coating material and the first light;
generating, based on the second plurality of light intensities and thicknesses of the plurality of coating layers, a second polynomial function associated with the first coating material and the second light;
in response to an absolute slope of the first polynomial function being greater than an absolute slope of the second polynomial function, recording the first light and the first polynomial function as being usable for detecting a thickness of a material layer formed of the first coating material;
recording the second light and a third polynomial function as being usable for detecting a thickness of a material layer formed of a second coating material for actual semiconductor fabrication process;
creating a database comprising a first entry and a second entry, the first entry including the first coating material, the first light and the first polynomial function, and the second entry including the second coating material, the second light, and the third polynomial function;
after creating the database, coating a resist layer over a substrate with a coating material selected from the first and second coating materials;
in response to a condition that the first coating material is selected, configuring, based on the first entry of the database, the first light as being usable to image the resist layer;
scanning a plurality of areas of the resist layer, wherein the scanning includes:
imaging the plurality of areas with the first light; and
recording a strength of the first light that is reflected from each of the plurality of areas during the imaging of the plurality of areas;
calculating a mean thickness of the resist layer using the recorded strength; and
adjusting process conditions for the coating of the resist layer based on the mean thickness.

14. The method of claim 13, wherein the scanning further includes sweeping a charge-coupled device (CCD) above the substrate.

15. The method of claim 13, wherein the calculating of the mean thickness includes:
determining a plurality of thicknesses corresponding to the plurality of areas using the recorded strength; and
averaging the plurality of thicknesses as the mean thickness.

16. The method of claim 13, wherein the adjusting of the process conditions includes adjusting a spinning speed of a spin-coating device that is configured to coat the resist layer.

17. The method of claim 13, wherein the calculating of the mean thickness comprises:
determining a plurality of thicknesses corresponding to the plurality of areas using the recorded strength;
assigning different weights to the plurality of thicknesses; and
averaging the plurality of thicknesses of different weights as the mean thickness.

18. A method of semiconductor manufacturing, comprising:
determining a first function associated with a first coating material and a first visible light having a first wavelength;
determining a second function associated with the first coating material and a second visible light, the second visible light having a second wavelength different than the first wavelength;
in response to a coefficient of determination of the first function being greater than a coefficient of determination of the second function, selecting the first function and the first visible light as being usable for determining a thickness of a resist layer formed of the first coating material;

forming a resist layer of the first coating material over a substrate with a spin-coating process;

catching an image of the resist layer, the image including a plurality of predetermined locations of the resist layer;

retrieving a strength of the first visible light from the image in each of the plurality of predetermined locations;

determining a plurality of thicknesses corresponding to the plurality of predetermined locations by using outputs of the first function alone as the thicknesses, wherein the first function is associated with a single variable as inputs to the first function, wherein the single variable is the strength of the first visible light;

generating a mean thickness by averaging the plurality of thicknesses; and adjusting a spinning speed of the spin-coating process according to the mean thickness.

19. The method of claim 18, wherein each of the first visible light and the second visible light comprises a red light, a green light, or a blue light.

20. The method of claim 18, wherein each of the first function and the second function is a polynomial function, and wherein the polynomial function is determined from a plurality of monitor wafers coated with a series of benchmarking resist layers of various thicknesses prior to the forming of the resist layer.

* * * * *